United States Patent [19]

Micheron

[11] 4,345,359
[45] Aug. 24, 1982

[54] PROCESS FOR MANUFACTURING A PIEZOELECTRIC TRANSDUCER MADE FROM A POLYMER MATERIAL

[75] Inventor: François Micheron, Paris, France

[73] Assignee: Thomson-CSF, Paris, France

[21] Appl. No.: 179,220

[22] Filed: Aug. 18, 1980

[30] Foreign Application Priority Data

Aug. 21, 1979 [FR] France ............................. 79 21086

[51] Int. Cl.³ .......................................... H01L 41/22
[52] U.S. Cl. .................................. 29/25.35; 264/22;
310/357; 310/367; 361/233
[58] Field of Search ................. 29/25.35; 361/233;
310/357, 367, 371; 264/22

[56] References Cited

U.S. PATENT DOCUMENTS 3,391,044 7/1968 Kaghan et al. ..................... 264/22
4,241,128 12/1980 Wang ............................. 361/233 X Primary Examiner—Carl E. Hall
Attorney, Agent, or Firm—Cushman, Darby & Cushman

[57] ABSTRACT

The invention relates to piezoelectric and pyroelectric transducers whose active element is formed by a polymer film. The invention provides a process for manufacturing a transducer from a flat polymer film which consists in stretching this film over a mold so as to give it a self-supporting form and to electroform this film by means of a corona discharge.

3 Claims, 9 Drawing Figures

FIG. 5(a)
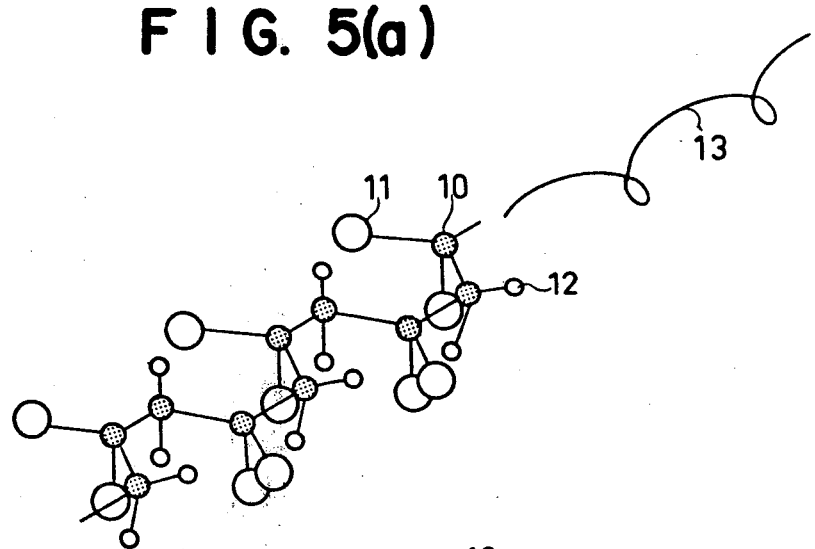
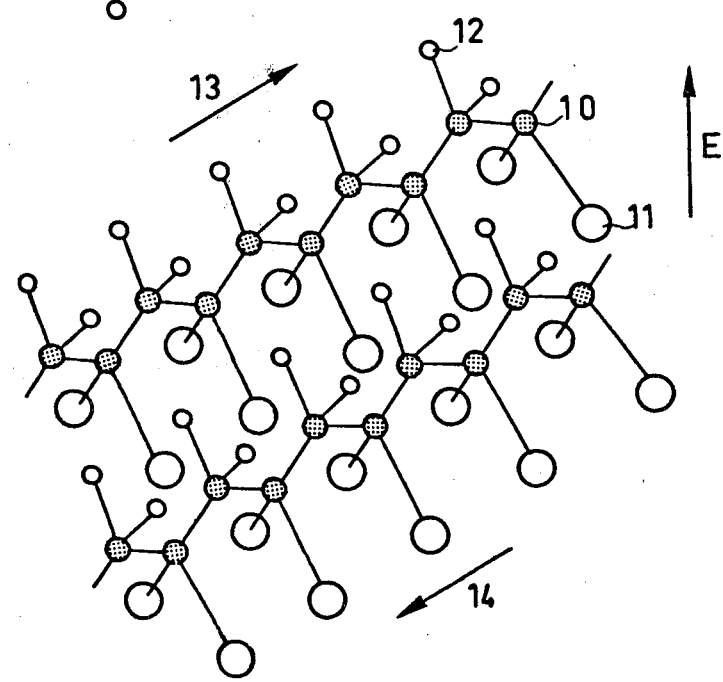
FIG. 5(b)

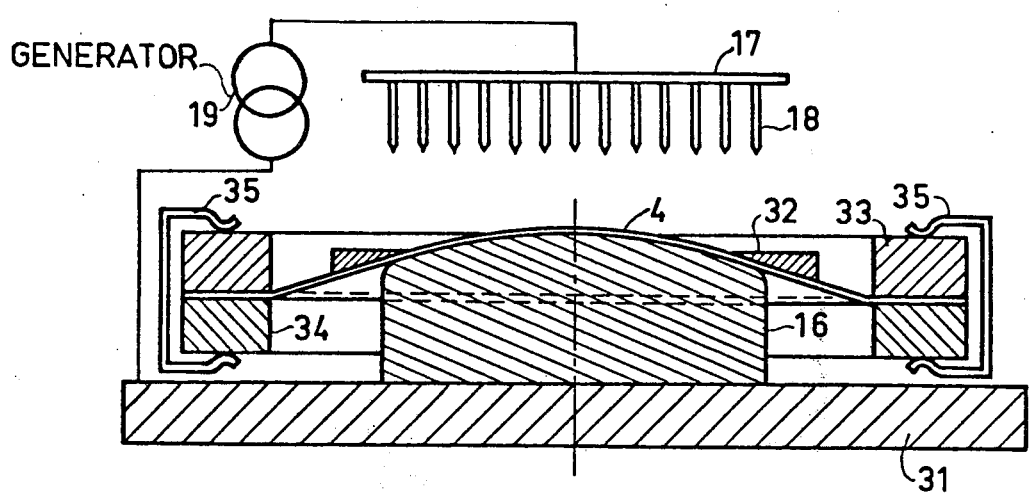
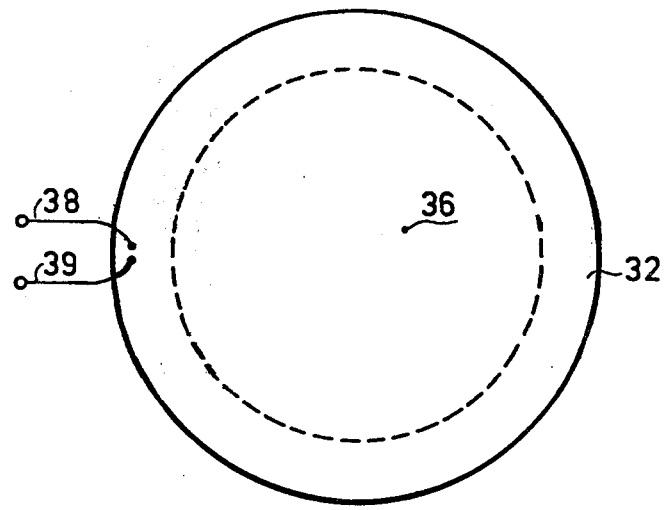

PROCESS FOR MANUFACTURING A PIEZOELECTRIC TRANSDUCER MADE FROM A POLYMER MATERIAL

BACKGROUND OF THE INVENTION

The present invention relates to transducers whose active element is formed by a film of polymer material having piezoelectric and pyroelectric properties similar to those possessed by bodies belonging to certain classes of crystals. The acquisition of the properties in question is based on the creation of an electric anisotropy by means of an intense electric field applied perpendicularly to the principal faces of the polymer film. To obtain a high electric polarization, it is useful to stretch the polymer film beforehand, so that the macromolecular chains present a dipolar moment. The stretching of the polymer film precedes the electric polarization, so as to obtain a mechanical anisotropy by thinning down which is favorable to the formation of a polar phase.

The basic polymer material most currently used for producing piezoelectric or pyroelectric transducers is vinylidene polyfluoride ($PVF_2$). Considering the small thickness of the film used for forming these transducers, it is advantageous to give it a self-supporting form by molding or heat-shaping along a non-developable surface. The form obtained is polarized electrically by means of electrodes covering these faces. These electrodes may be solid, liquid or gaseous, but the polarization operation requires in general the heat-shaped film to be replaced on a mold, for it tends to shrivel up as soon as it is heated to a relatively high temperature. This manufacturing technique is advantageous to the extent that it allows complex forms to be obtained which may correspond to very great extensions. However this method does not give entire satisfaction when the desired forms are slightly curved. The buttressing between fixed supports of a slightly curved form provides a movement amplifying effect which is particularly useful in practice to obtain a large vibratory amplitude. However, it is necessary to make sure that the forms using this effect have very precise dimensional characteristics. The technique of manufacturing by heat-shaping is then not well adapted to obtaining simple forms requiring great dimensional stability. It also has the disadvantage of requiring separate operations which are the shaping of the film and subsequently the electric polarization thereof.

In order to palliate these disadvantages, the invention provides shaping of the polymer film in the non-polar phase by stretching it over a metal former and by causing the relaxation of the mechanical tensions thus created under the action of the electric polarizing field transforming the non-polar phase into the polar phase.

SUMMARY OF THE INVENTION

The invention provides a process for manufacturing a transducer whose active element is formed by a polymer film polarized electrically in a direction perpendicular to its faces and forming a self-supporting structure, characterized in that it consists in stretching a flat film of polymer material in the non-polar phase on a non-developable conducting surface; in electroforming this stretched film by means of an ionizing electric discharge produced by means of an electrode equipped with points which overhang this conducting surface and in providing with electrodes the faces of the electroformed zone of this film.

The invention also provides a piezoelectric transducer whose active element is formed by a polymer film forming a self-supporting structure provided with electrodes on both its faces, characterized in that the part of the film between these electrodes contains at least one electroformed zone mechanically relaxed and endowed with a polar phase.

DESCRIPTION OF THE DRAWINGS

The invention will be better understood from the following description and accompanying figures in which:

FIG. 5 (a) shows a macromolecular chain of vinylidene polyfluoride in the non-polar phase $\alpha$ and FIG. 5 (b) shows two adjacent chains in the polar phase $\alpha_p$.

FIG. 6 is a sectional view of the means for implementing the manufacturing process of the invention.

FIG. 7 (a) shows in elevation and FIG. 7 (b) in a top view a piezoelectric transducer in accordance with the invention.

DESCRIPTION OF THE PREFERRED EMBODIMENT

Figure 1:
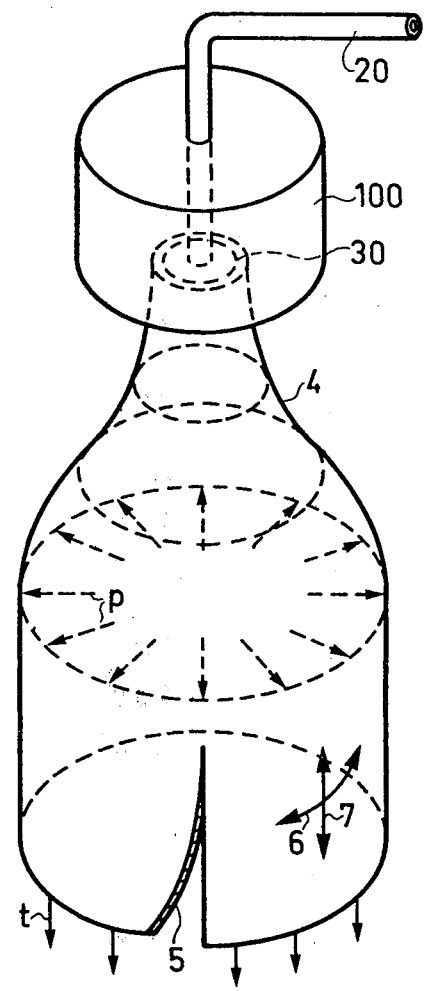
FIG. 1 shows how a bi-stretched polymer film may be obtained.
Figure 2:
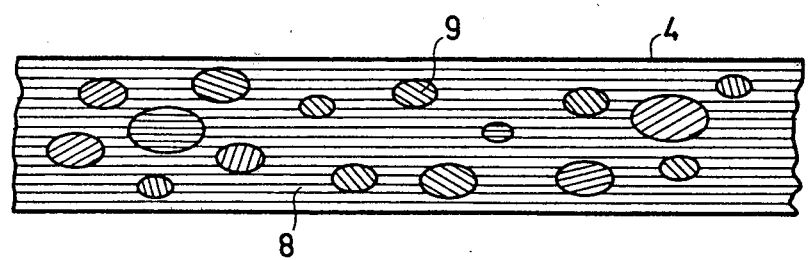
FIG. 2 is a sectional view of the polymer film of FIG. 1.

In FIG. 1 there can be seen by way of non-limiting example a device for manufacturing by extrusion and blowing a polymer film such as vinylidene polyfluoride. This device comprises a crucible 100 which contains the polymer at a temperature close to that of melting. The bottom of the crucible is fitted with an annular ejection orifice 30 which confers on the extruded polymer a tubular form. A pipe 20 communicating with the central part defining orifice 30 enables a gas to be blown inside the extruded tubular form. Because of the interior pressure p and the pull t exerted on the tubular form 4, the extruded envelope is caused to widen out. This latter is transformed at the lower part into a sheath of uniform thickness which may be opened out into a bi-stretched flat film when a cut 5 is made. The circumferential stretching 6 is produced by the action of pressure p, whereas the axial stretching 7 results from the pull t.

The bi-stretched film 4 is flat after being opened out. The internal structure is composed of crystalline clusters 9 enclosed in an amorphous matrix 8. Since the bi-stretched polymer film is obtained under conditions close to the melted condition, it is macroscopically isotropic in its plane and the crystalline clusters 9 are very little flattened. The bi-stretched film is in the non-polar phase $\alpha$, for the macromolecular chains inside the crystalline clusters have a helical arrangement. Such an arrangement is shown at (a) in FIG. 5. The carbon atoms 10, the hydrogen atoms 12 and the fluorine atoms 11 are disposed in a macromolecular chain having a helical structure 13. There also exists another phase $\beta$ where the macromolecular chains have the zig-zag configuration shown at (b) in FIG. 5. It can be seen that phase $\beta$ is polar, but in the case of molten polymer it is well in the minority with respect to the non-polar phase $\alpha$. It is useful to recall that the $\alpha$ phase may give rise to the polar phase with zig-zag macromolecular chains when the polymer film is stretched short of the melting temperature.

Figure 3:
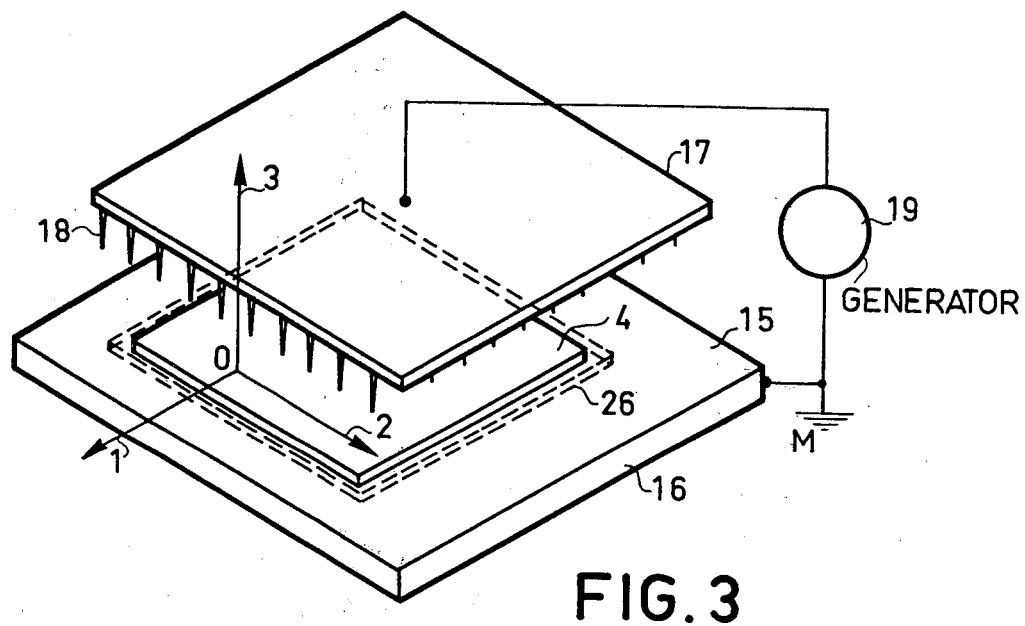
FIG. 3 is an isometric view of a polarizing device using the corona discharge.

In FIG. 3 can be seen a device for electrically polarizing a polymer film 4. This device comprises a conducting plate 16 connected to ground M. The polymer film 4 is deposited on the flat face 15 of plate 16. An electrode 17 having points 18 overhangs surface 15. A high-voltage generator is connected to plate 16 and to electrode 17. The polarizing voltage is chosen so as to produce a corona discharge. The ionization generated by points 18 creates a very intense electric field within the film. Because of the high charge density existing on the faces of film 4, a high electrostatic pressure tends to crush it, to such an extent that it stretches out and may pucker locally. The puckering of film 4 may be prevented by coating the conducting plane 15 with an appropriate lubricant such as a silicon oil. Under these conditions, film 4 polarized in direction 3 extends isotropically in directions 1 and 2. The extension observed in the case of a bi-stretched polymer film is isotropic in the plane containing directions 1 and 2 as long as its thickness is uniform. After applying continuous polarization for about twenty seconds, a permanent extension of film 4 may be observed of several percent. It at this stage the sign of the polarization is reversed, the film whose contour reached the broken line trace 26 may come back to its original dimensions. To cause it to return to its initial dimensions, it is sufficient to subject the film to a reversed polarization voltage of an amplitude less than that which had served for its extension. If this experiment is followed by a polarization phase with an increased reverse voltage, it can be seen that film 4 stretches again as far as contour 26.

To give a general idea, a suitably lubricated polished aluminium support 16 may be used with an electrode 17 whose points 18 are spaced fifteen millimeters from surface 15.

By operating at ambient temperature, a bi-stretched film 4 of vinylidene polyfluoride having a uniform thickness between 6 and 25 microns undergoes permanent extension of a few percent when the polarizing voltage applied creates within the film an electric field close to the breakdown electric field. For a film with a thickness of 16 microns the polarizing voltage required for electroforming film 4 is of the order of 15 kV. The permanent deformation is acquired after the voltage has been applied for about twenty seconds. Film 4 is so polarized to saturation, for if the polarizing time is extended, the piezoelectric coefficients do not increase. The measurement of the piezoelectric coefficients $d_{31}$ and $d_{32}$ leads to values between 2 and $5.10^{-12}$ Coulomb/Newton.

The following interpretation of the phenomena observed may be given. The film in its initial state was bi-stretched at a temperature close to that of melting, so that it is formed principally by the isotropic nonpolar phase $\alpha$. This is confirmed by an examination of the infrared absorption spectra and reference can be made to illustration ($a$) of FIG. 5 which shows the configuration of a macromolecular chain. When the film has received a first polarization, the $\alpha$ phase is transformed into a so-called $\alpha\rho$ phase where one chain out of two is reversed so that the dipoles associated with the adjacent and parallel chains add their effects. This situation is illustrated at ($b$) in FIG. 5. On the basis of X-ray of diffraction patterns, it can be seen that the chain which reverses must undergo a translation with respect to its non-reversed neighbor. These translations are represented at ($b$) in FIG. 5 by arrows 13 and 14 and occur under the action of the polarizing electric field E. One is inclined to assume that the reversing and sliding actions which have just been mentioned are of a nature to cause in the crystalline zones of the polymer dimensional modifications which have as a consequence the extension observed macroscopically.

This interpretation is all the more plausible in that it justifies the retraction observed under reversed polarization of average intensity and the extension which reappears when the reverse polarization again saturates the film.

A variation of the experiment described above further reinforces the plausible character of the interpretation given above. Before electric polarization, film 4 is placed under a mechanical tension. For that, film 4 is stretched on support 16 and is maintained in the deformed condition 26 by means of adhesive strips bordering this contour. Then film 4 is polarized and it can be observed that the mechanical tensions which existed in directions 1 and 2 have relaxed.

After removal of the adhesive strips, the film keeps the extended form 26. If electrodes are deposited on both faces of film 4 and if an alternating voltage is applied to these electrodes so that the assembly operates like a piezoelectric transducer, the film vibrates in thickness and undergoes isotropic extensions in its plane, but this alternating energizing voltage has no adverse influence on the polarization and the extension acquired durng the electroforming operation.

The electroforming of a polymer film presents a real interest when it is a question of giving to a flat film of uniform thickness a self-supporting form. In fact, a very thin flat film is deprived of mechanical resistance to forces acting perpendicularly to its surface. So it it is necessary to stretch it on a curved support which complicates the production of a transducer and tends to diminish the performances thereof. Furthermore; a flat film does not lend itself well to the implementation of a buttressing effect which allows small extensions in directions 1 and 2 to be converted into considerably amplified movement in direction 3.

Figure 4:
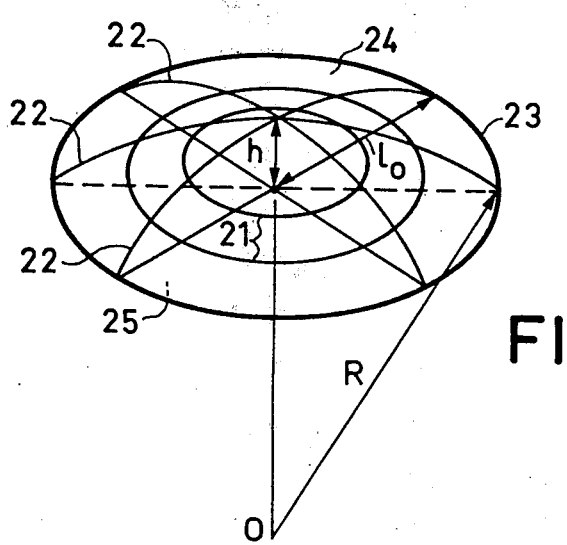
FIG. 4 is an explanatory figure.

In FIG. 4 there is shown a non-developable surface in the form of a spherical calotte 24. The radius of curvature of this calotte is R, its height is h and the diameter of its circumference 23 is $2l_o$.

Assuming that contour 23 has been drawn on a resilient flat film 25 and that this film has been deformed so as to take on the exact shape of calotte 23, an attempt may be made to estimate the extensions undergone by the film as a function of data h, $l_o$ and R. Passing from the flat form to the spherical form implies extensions varying along meridians 22 and whose values are distinct along parallels 21. In fact, the extension is zero insofar as contour 23 is concerned and it is essentially directed along the meridians 22 in the vicinity of contour 23.

On the other hand, the relative surface increase $\Delta S$ of the film may be easily assessed and an average proportional extension ($\Delta S/1$) assumed isotropic may be deduced therefrom which gives a good idea of the possibilities of electroforming. The principal results of such a calculation are the following:

$$R = \frac{h^2 + l_o^2}{2h} \qquad (1)$$

-continued
$$\frac{\Delta S}{S} = \frac{h^2}{l_o^2} = \frac{(\Delta l)}{l} + \frac{(\Delta l)^2}{l}$$

from which can be derived:

$$\frac{\Delta l}{l} = \sqrt{1 + \frac{h^2}{l_o^2}} - 1$$

That is to say, if $h/l_o << 1$ $$\frac{\Delta l}{l} \simeq \frac{1}{2} \frac{h^2}{l_o^2} \qquad (2)$$

By way of numerical example, $l_o = 4$ cm and a proportional isotropic extension $(\Delta l/l) = 2.10^{-2}$, the following dimensions are obtained:

$$h = \sqrt{2l_o^2} \; \frac{\Delta l}{l} = 0.8 \text{ cm}$$

$$R = \frac{h^2 + l_o^2}{2h} = 10.4 \text{ cm}$$

The preceding results show that electroforming leads to self-supporting structures whose bending is sufficient to ensure good behavior of the film. Since the polymer film is calibrated in thickness, the electroformed zone may be polarized to saturation over the whole of its extent, which ensures very homogeneous operation of the transducer not only in piezoelectric but also in pyroelectric applications.

FIG. 6 shows a device implementing the electroforming process of the invention. It comprises a table 31 connected to the ground of an electric generator 19. A conducting mold 16 rests on table 31. Its lubricated upper face has the convex shape of a spherical calotte. A film of polymer material 4 is nipped in the flat condition between two rings 33 and 34 held clamped to one another by clips 35. The whole assembly formed by film 4 and the annular frame 33, 34, 35 covers the upper face of mold 16. Under the action of the weight and if need be a vertical thrust, film 4 is stretched over mold 16 while taking on the exact shape of its upper face. An electrode 17 connected to the generator 19 is placed overhanging the stretched zone of film 4; this electrode is provided with points 18 which allow a corona discharge to be obtained. An annular piece 32 may be fixed to the periphery of film 4 before application of the electric electroforming voltage. This very rigid annular piece 32 girdles film 4 in the spherical calotte-shaped zone.

When the electric polarizing voltage is applied, the mechanical tensions relax in the bent zone of film 4 which is inside the collar 32. Mechanical tensions still exist in the annular stretched zone of film 4 which surrounds collar 32, for the electric field is small in this latter zone. Once the electroforming is finished, the nipping frame 33, 34 may be withdrawn and removed. Thus a transducer element is obtained such as shown in elevation and in a top view in FIG. 7.

The transducer element of FIG. 7 is obtained by cutting off film 4 which extends beyond the contour of collar 32. Conducting deposits 36 and 37 are made on the principal faces of film 4. One of these deposits may without disadvantage cover collar 32. Supply wires 38 and 39 are connected to deposits 36 and 37 so as to allow an energizing AC voltage to be applied in the case of operation as a piezoelectric motor. Wires 38 and 39 serve for collecting an electric voltage during the reverse operation as a piezoelectric vibrating sensor and during use as a pyroelectric radiation detector.

It should be pointed out that collar 32 may be fixed after electroforming of film 4. The stretched zones of film 4 not subjected to the electroforming field may relax due to the relaxing of the tensions in the central part of film 4, but these non-electroformed zones keep the flat shape of non-stretched film 4.

The transducer of FIG. 7 forms advantageously a piezoelectric loudspeaker usable between 8 and 40 kHz. In this case, collar 32 may be made from steel and deposit 36 and 37 formed by vacuum evaporation of aluminium.

The structure of FIG. 7 lends itself well to the formation of piezoelectric earphone membranes and diaphragms for piezoelectric microphones. It may also serve as a pyroelectric sensor, particularly for the detection of intruders and for fire detection.

Although there has been described in what has gone before and shown in the drawings the essential characteristics of the present invention applied to a preferred embodiment thereof, it is obvious that a man skilled in the art may make any modifications thereto of form or detail which he considers useful, without departing from the scope of said invention. In particular, the polymer film may also be obtained by dissolving the polymer in a solvent to form a thin layer which is transformed into a solid film after evaporation of the solvent. The electroforming is not limited to a spherical form having a circular perimeter. Any self-supporting form allowing the film to be stretched so as to create therein extensions of a few percent is appropriate. The tensioning of the film may be achieved by means of a nipping frame and a convex mold, but mechanical tension may also be provided by the action of a gas under pressure or by suction.

What is claimed is:

1. A process for manufacturing a transducer whose active element is formed by a polymer film polarized electrically in a direction perpendicular to its faces and forming a self-supporting structure, this process consisting in stretching a flat film of polymer material in the non-polar phase over a non-developable conducting surface, in electroforming this stretched film by means of an ionizing electric discharge produced by means of an electrode provided with points which overhang this conducting surface and in providing with electrodes the faces of the electroformed zone of this film.

2. The process as claimed in claim 1, wherein the conducting surface has a convex shape and the flat film nipped in a rigid frame is pressed against this conducting surface so as to take on the exact shape thereof.

3. The process as claimed in claim 2, wherein the electroformed zone of the film is girdled with a rigid collar before application of the ionizing electric discharge.

* * * * *